United States Patent [19]

Efland et al.

[11] Patent Number: 5,736,766
[45] Date of Patent: Apr. 7, 1998

[54] MEDIUM VOLTAGE LDMOS DEVICE AND METHOD OF FABRICATION

[75] Inventors: Taylor R. Efland, Richardson; Stephen C. Kwan, Plano, both of Tex.

[73] Assignee: Texas Instruments Incorporated, Dallas, Tex.

[21] Appl. No.: 353,865

[22] Filed: Dec. 12, 1994

[51] Int. Cl.⁶ .................................................. H01L 27/02
[52] U.S. Cl. .......................... 257/338; 257/341; 257/401
[58] Field of Search .............................. 257/335, 336, 257/337, 338, 344, 341, 340, 401

[56] References Cited

U.S. PATENT DOCUMENTS

| | | | |
|---|---|---|---|
| 4,922,327 | 5/1990 | Mena et al. | 257/336 |
| 5,191,401 | 3/1993 | Shirai et al. | 257/328 |
| 5,430,316 | 7/1995 | Contiero et al. | 257/355 |

*Primary Examiner*—Donald Monin
*Attorney, Agent, or Firm*—W. James Brady, III; Richard L. Donaldson

[57] ABSTRACT

An LDMOS transistor (10) having a medium breakdown voltage and low Rsp includes a high voltage (n–) Nwell (38); a low voltage (n+) Nwell (42) formed in the high voltage Nwell (38); a drain region (64) formed in the low voltage Nwell (42); a Dwell (44) formed in the Nwell (70), the DWELL (46) including a p region (46) forming the backgate and a source region (48), a channel region (46a) defined between an edge of the source region (48) and an edge of the p region (46); and a gate (58) extending over the channel region (46a). Gate (58) extends onto a field oxide region (54) formed using a minimum photolithographic nitride opening to reduce the length of the drift region thus reducing Rsp. Rsp is also reduced by the addition of low voltage Nwell (42) to the drift region since low voltage Nwell (42) is more heavily doped than high voltage Nwell (38) thus reducing Rdson. The low voltage Nwell (42) added to the drift region also provides a reduction in breakdown voltage BV by increasing the field in the curvature region of the Dwell (46). Fabrication of transistor (10) is compatible with VLSI processes.

6 Claims, 5 Drawing Sheets

MEDIUM VOLTAGE LDMOS DEVICE AND METHOD OF FABRICATION

FIELD OF THE INVENTION

This invention relates to semiconductor devices and, more particularly, to an LDMOS (lateral double-diffused "metal"oxide semiconductor) device for medium voltage applications and method of fabrication thereof.

CROSS-REFERENCE TO RELATED APPLICATIONS

The following U.S. patent applications are hereby incorporated by reference:

Ser. No. 857,360, filed Mar. 25, 1992, now U.S. Pat. No. 5,242,841 and Ser. No. 915,036, filed Jul. 16, 1992, now U.S. Pat. No. 5,275,961.

BACKGROUND OF THE INVENTION

LDMOS (lateral double-diffused MOS) devices are quickly replacing bipolar devices as power devices in intelligent power integrated circuits due to their performance advantage. The proliferation of increasingly diversified applications for power integrated circuits has led to a desire for components having a wide range of breakdown voltages (BVdss). However, LDMOS devices presently used in VLSI processes are limited to high (60–80V) breakdown voltages due to the unavailability of medium voltage (40–50V) VLSI compatible LDMOS devices having low specific on-resistance (Rsp).

SUMMARY OF THE INVENTION

Accordingly, a need exists for LDMOS devices having medium breakdown voltages and low Rsp.

Generally, and in one form of the invention, a transistor includes: a semiconductor layer having a first region of a first conductivity type, the first region having a first dopant concentration; a second region of the first conductivity type first formed at a face of the semiconductor layer in the first region, the second region having a second dopant concentration greater than the first dopant concentration; a drain region of the first conductivity type formed at a face of the semiconductor layer in the second region, the drain region having a third dopant concentration greater than the second dopant concentration; a third region of a second conductivity type opposite the first conductivity type formed at a face of the semiconductor layer in the first region; a source region of the first conductivity type formed at a face of the semiconductor layer in the third region, a channel region defined in the third region between an edge of the source region and an edge of the third region; and a gate extending over the channel region.

In another form of the invention, a method for fabricating a transistor, includes the steps of: forming a semiconductor layer having a first region of a first conductivity type, the first region having a first dopant concentration; forming a second region of the first conductivity type first at a face of the semiconductor layer in the first region, the second region having a second dopant concentration greater than the first dopant concentration; forming a drain region of the first conductivity type at a face of the semiconductor layer in the second region, the drain region having a third dopant concentration greater than the second dopant concentration; forming a third region of a second conductivity type opposite the first conductivity type at a face of the semiconductor layer in the first region; forming a source region of the first conductivity type at a face of the semiconductor layer in the third region, a channel region defined in the third region between an edge of the source region and an edge of the third region; and forming a gate extending over the channel region.

An advantage of the invention is the ability to achieve a reduction in Rsp where breakdown voltage BV can be reduced. A reduction in Rsp results from a reduction in drift length due to the formation of LOCOS field oxide by a minimum geometry nitride opening. Rsp is also reduced by the addition of a low voltage (n+) Nwell to the drift region. The low voltage Nwell added to the drift region also provides a reduction in breakdown voltage BV by increasing the field in the curvature region of the Dwell. Another advantage of the invention is the provision of a transistor having a low Rsp and medium breakdown voltage BV that can be fabricated without additional process costs in an available VLSI process.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
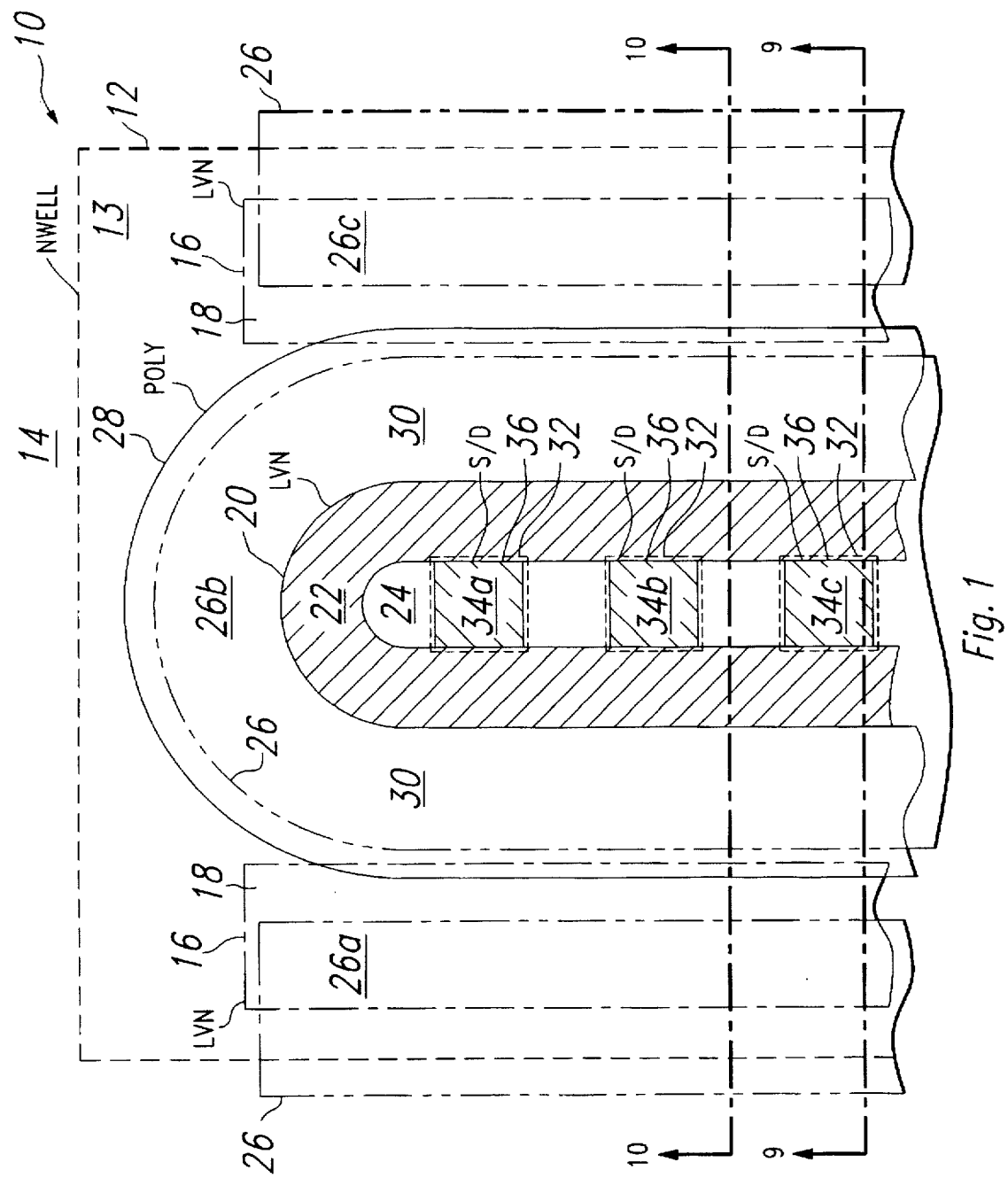
FIG. 1 is a layout plan view showing mask levels of an LDMOS transistor according to the present invention.

FIG. 1 is a layout plan view showing photomask levels used during fabrication of an LDMOS transistor 10 according to the present invention. The photomask levels are described in the order in which they are used. As seen in FIG. 1, a high voltage Nwell mask 12 is used to expose an area 13 of a p-type epitaxial layer 14 in which an n type implant is performed to form a high voltage (n–) Nwell or tank. Those areas outside of area 13 are protected by high voltage Nwell mask 12 during the implant. A low voltage Nwell mask 16 is used to expose areas 18 in Nwell area 13 in which an n type implant is performed to form low voltage (n+) Nwells or tanks. Those areas outside of areas 18 are protected by low voltage Nwell mask 16 during the implant.

An annular Dwell mask 20 exposes an annular Dwell area 22 in the Nwell area 13 in which p and n type implants are performed to form a Dwell. Those areas outside of area 22 are protected by Dwell mask 20 during the implants. Annular Dwell area 22 surrounds area 24 which is protected during the p and n type implants that form the Dwell.

A mask 26 protects areas 26a–c while exposing and permitting field oxide to grow over areas other than areas 26a–26c to define the LDMOS transistor channel regions.

An annular polysilicon gate mask 28 protects polysilicon in annular area 30 while exposing polysilicon in areas other than area 30 during gate etch to define the LDMOS transistor gate.

An inverse n+ drain/source contact mask 32 protects regions 34a–34c leaving the remainder of the device exposed during an n type implant performed to form n+ drain regions and n+ source contact regions. A p+ backgate contact mask 36 exposes regions 34a–34c in which a p type implant is performed to form p+ backgate contact regions. Those areas outside of areas 34a–34c are protected by mask 36.

Figure 11:
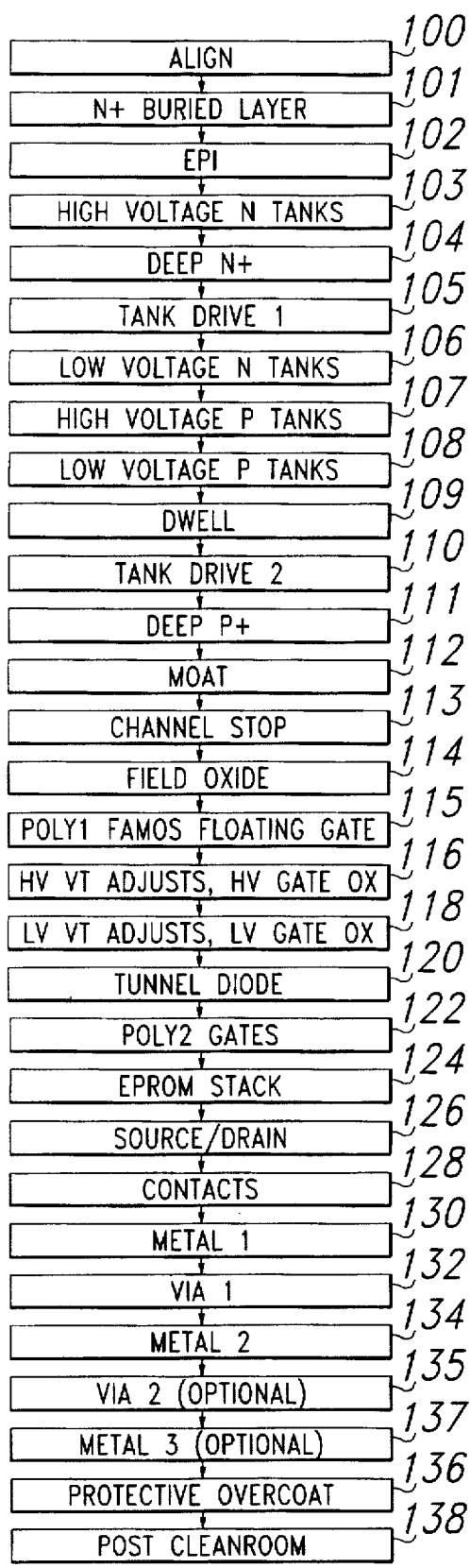
FIG. 11 is a flow diagram of a VLSI process may be used to perform the LDMOS transistor fabrication described in FIGS. 2–10.

FIGS. 2—9 are cross sectional elevation views taken along section lines 9—9 of FIG. 1 showing LDMOS transistor 10 at successive stages during fabrication. Fabrication of LDMOS transistor 10 is compatible with the VLSI process described in U.S. Pat. No. 5,242,841 thus permitting LDMOS transistor 10 to be fabricated on the same chip with the devices described in U.S. Pat. No. 5,242,841. The process flow described in U.S. Pat. No. 5,242,841 is shown in FIG. 11.

Figure 2:
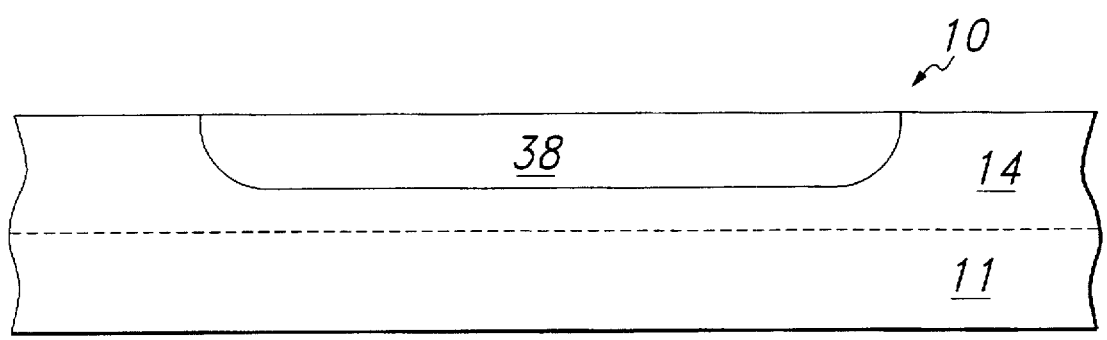
FIGS. 2–9 are cross-sectional elevation views taken along section line 9—9 of FIG. 1 showing the LDMOS transistor according to the present invention at successive stages during fabrication.
Figure 3:
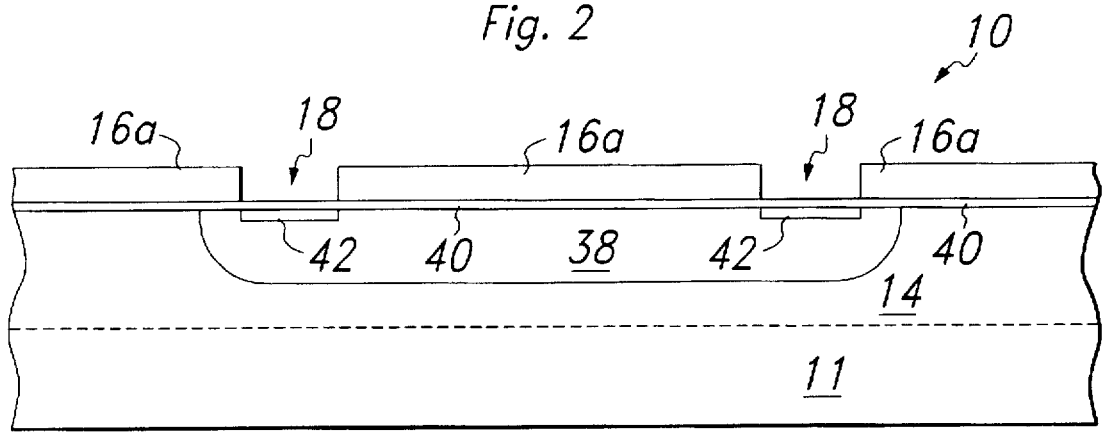
Figure 4:
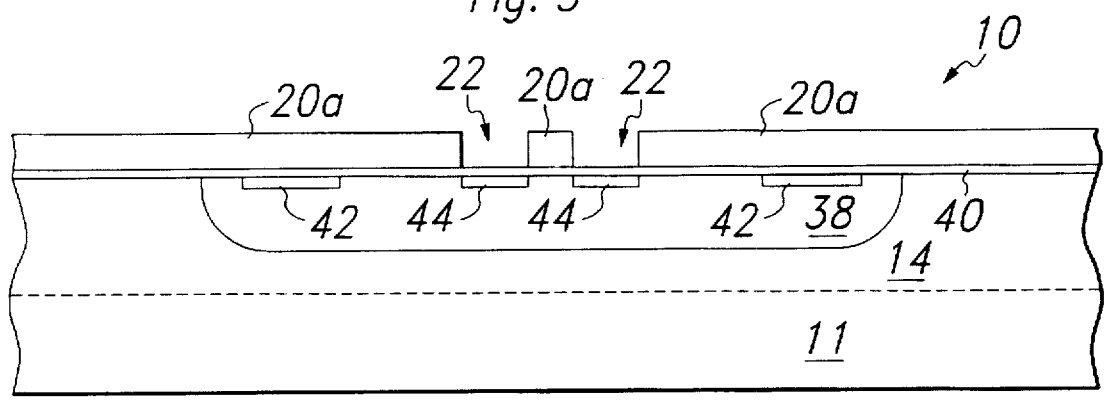

Referring to FIG. 2, fabrication of LDMOS transistor 10 initially begins with the formation of p– epitaxial layer 14 (step 102 in FIG. 11) on p+ substrate 11 which has a resistivity of about 0.015 $\Omega$-cm. An oxide layer (not shown) is then formed over p– epitaxial layer 14. A nitride layer (not shown) is formed over the oxide layer and patterned and etched using high voltage Nwell mask 12 (see FIG. 1) to open a window exposing area 13 (see FIG. 1) at the surface of epitaxial layer 14. An n type dopant, such as phosphorous with a dose of about 4.0E12 atoms/cm$^2$ at an energy of about 80 KeV, is then implanted through the window into area 13 of p– epitaxial layer 14 to form high voltage Nwell 38 (step 103 in FIG.11). The oxide and nitride layers are then removed, using a plasma etch, for example. A drive-in step (step 105 in FIG.11) is then performed to diffuse high voltage Nwell 38 resulting in the structure of FIG. 2. Nwell 38 is low concentration (n–), deep diffusion well.

An oxide layer 40 is then deposited or grown over the surface of epitaxial layer 14. A layer of photoresist 16a is deposited over oxide layer 40 and patterned and etched using low voltage Nwell mask 16 (see FIG.1 ) to expose areas 18 at the face of Nwell 38. An n type dopant, such as phosphorous with a dose of about 8.0E12 atoms/cm$^2$ at an energy of about 80 KeV, is then implanted in areas 18 in Nwell 38 to form low voltage Nwells 42 (step 106 in FIG.11) resulting in the structure of FIG.3.

Photoresist layer 16a is then removed, using a wet etch, for example, and a layer of photoresist 20a deposited over oxide layer 40 and patterned and etched using Dwell mask 20 (see FIG. 1) to expose annular area 22 at the face of Nwell 38. Implants of p and n type dopants, with the n type dopant having substantially less diffusivity than the p type dopant, are performed in area 22 resulting in the structure of FIG. 4 (step 109 of FIG. 11). A suitable p type dopant is boron with a dose of about 6.7E13 atoms/cm$^2$ at an energy of about 100 KeV. A suitable n type dopant is arsenic with a dose of about 1.0 E14 atoms/cm$^2$ at an energy of about 120 KeV.

Figure 5:
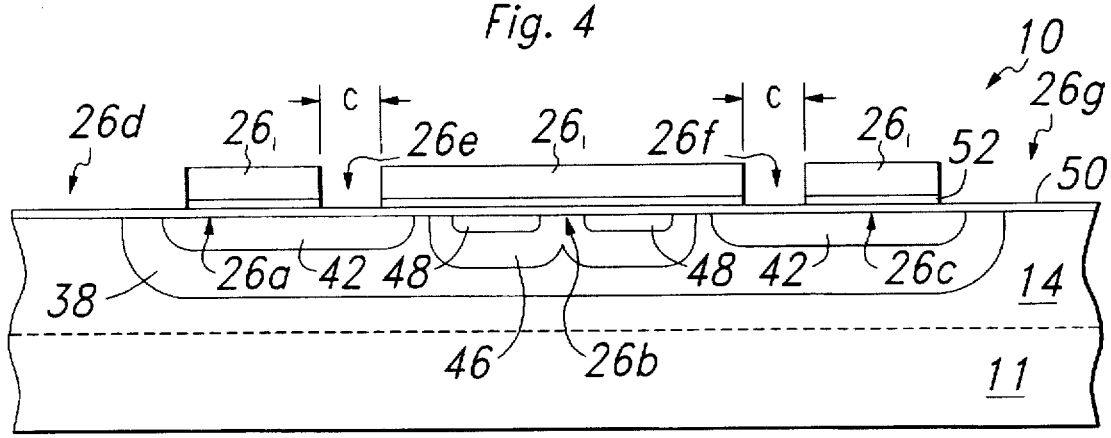

Photoresist layer 20a is then removed, using a wet etch for example. A drive-in step, for example 80 minutes at 1100 degrees Centigrade, is performed to diffuse the n and p type implants in Dwell 44 with the result that the deeper p type implant forms the Dwell backgate/channel region 46 while the shallower n type implants form n type source regions 48 (step 110 of FIG. 11). The drive-in step also drives low voltage Nwells 42 deeper into Nwell 38 as shown in FIG. 5. Oxide layer 40 is then removed.

A pad oxide layer 50 having a thickness of about 400 Angstroms is formed over the surface of p epitaxial layer 14 and Nwell 38. An LPCVD nitride layer 52 having a thickness of about 1400 Angstroms is formed over pad oxide layer 50. A layer of photoresist $26_1$ is deposited over nitride layer 52 and patterned and etched using mask 26 (see FIG. 1). Nitride layer 52 is then patterned and etched using photoresist layer $26_1$ as a mask to cover regions 26a–26c and expose regions 26d–26g at the surface of Nwell 38 and epitaxial layer 14 resulting in the structure of FIG. 5. The width c of the openings in nitride layer 52 exposing regions 26e and 26f is selected to be very narrow, preferably as small as the photolithography will allow. For a 1.04 micron process, width c is preferably also 1.04 microns.

Figure 6:
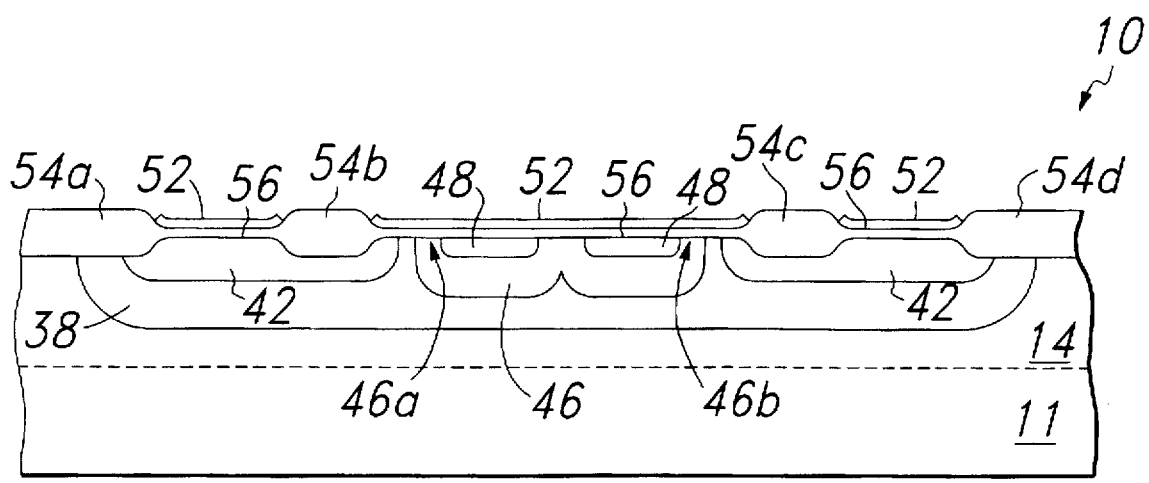
Figure 7:
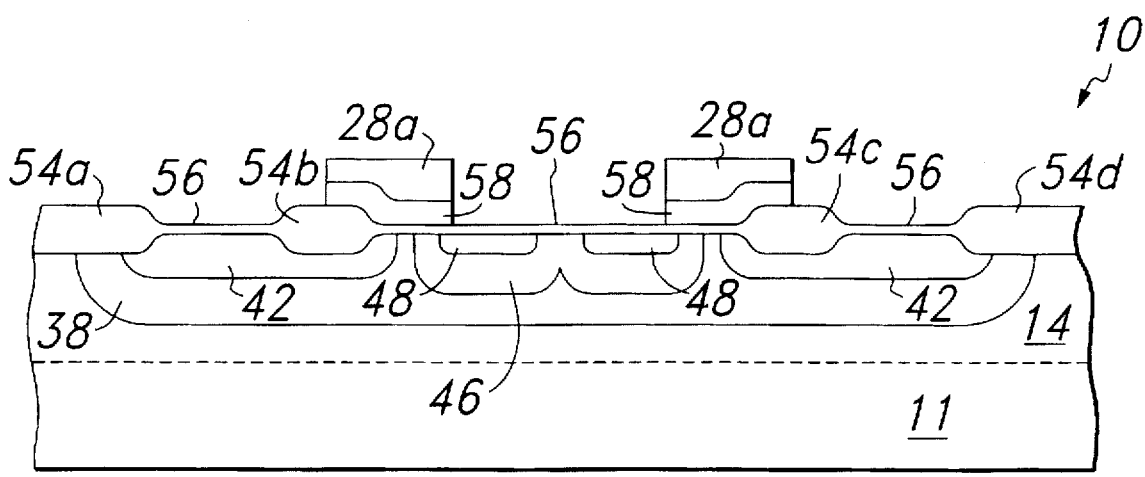
Figure 8:
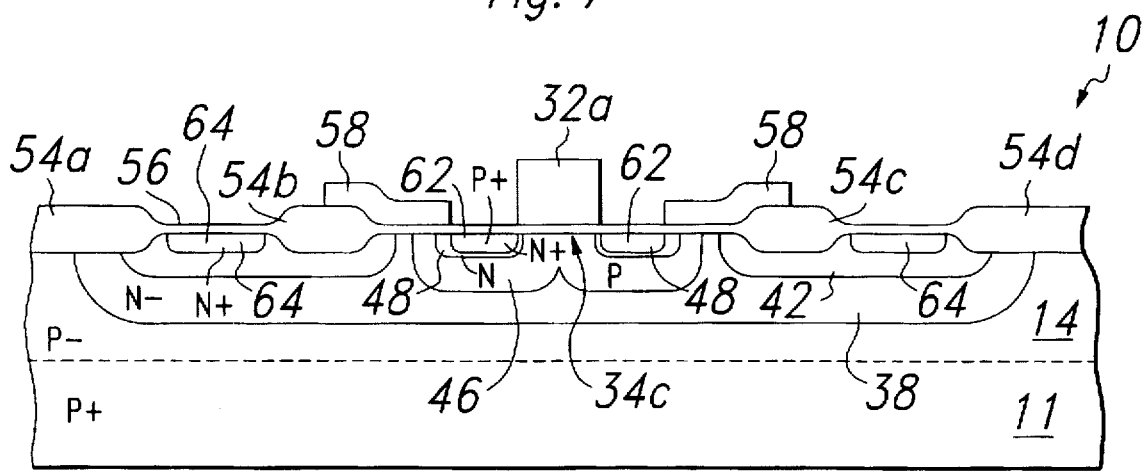
Figure 9:
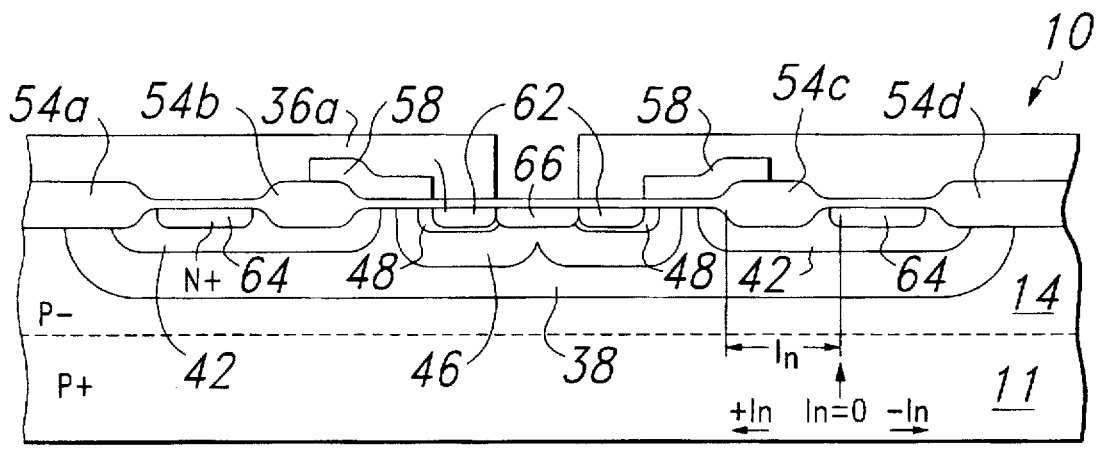

Photoresist layer 26m is then removed and field oxide regions 54a–54d are thermally grown in exposed locations 26d26g (step 112 in FIG. 11) resulting in the structure of FIG. 6. Field oxide regions 54a and 54d have thicknesses of about 7600 Angstroms, for example. Field oxide regions 54b and 54c are less thick than field oxide regions 54 a and 54d due to the fact that the openings in nitride layer 52 exposing areas 26e and 26f of FIG. 5 are narrower in width than the openings exposing areas 26d and 26g of FIG. 5.

Pad oxide layer 50 and nitride layer 52 are then removed, for example by plasma etching. A gate oxide layer 56 is then thermally grown over the face of Nwell 38 between adjacent field oxide regions 54a–54d to a thickness of about 500 Angstroms (step 116 of FIG. 11). An optional low voltage threshold adjust Vt implant may then be performed in channel regions 46a (step 118 of FIG. 11). A polysilicon layer with a thickness of about 4500 Angstroms, for example, is then deposited over gate oxide layer 56 and field oxide regions 54a–54d and doped with an impurity, such as phosphorus, to render it conductive. A layer of photoresist 28a is deposited over the polysilicon layer and patterned and etched using gate mask 28 (see FIG. 1). The polysilicon layer is then etched using photoresist layer 28a as a mask to form annular gate 58 resulting in the structure shown in FIG. 7 (step 122 of FIG. 11). Gate 58 extends up onto field regions 54b and 54c.

Photoresist layer 28a is then removed. A layer of photoresist 32a is formed over the device and patterned and etched using n+ drain/source contact mask 32 (see FIG. 1) to block regions 34a–34c (see FIG. 1) while exposing the remainder of the device. An implant of an n type impurity, such as phosphorus with a dose of about 4.0E14 atoms/cm$^2$ at an energy of about 80KeV followed by arsenic with a dose of about 5.0E15 atoms/cm$^2$ at an energy of about 120 KeV, for example, is then performed to form n+ source contact regions 62 and n+ drain regions 64 resulting in the structure shown in FIG. 8 (step 126 of FIG. 11). N+ source contact regions 62 are formed in source regions 48. N+ drain regions 64 are formed in low voltage Nwells 42.

Figure 10:
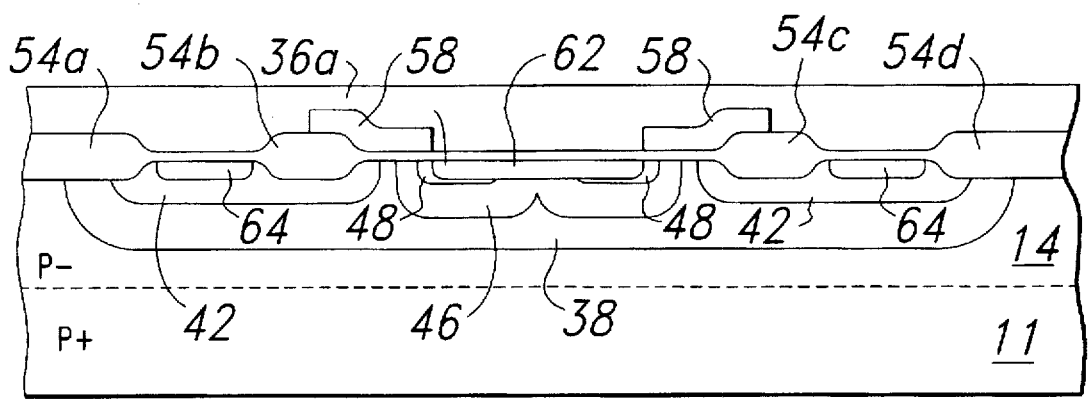
FIG. 10 is a cross-sectional elevation view taken along section line 10—10 of FIG. 1 showing the LDMOS transistor according to the present invention at the same stage during fabrication as that of FIG. 9.

Photoresist layer 32a is then removed and n+ source contact regions 62 and n+ drain regions 64 annealed. A layer of photoresist 36a is then formed over the device and patterned and etched using p+ backgate contact mask 36 (see FIG. 1) to expose regions 34a–34c (see FIG. 1). A p type dopant, for example boron with a dose of about 2.0E 15 atoms cm$^2$ at an energy of about 25 KeV, is then implanted in regions 34a–34c to form p+ backgate contact regions 66 (step 126 of FIG. 11) resulting in the structure shown in FIG. 9. As seen in FIG. 10, which is a cross-sectional elevation view taken along section lines 10—10 of FIG. 1 at this point in the process, n+ source contact region 62 is continuous in areas between p+ backgate contact regions 66. The use of a windowed n+ source contact region 62 with a plurality of p+ backgate contact regions 66 extending through windows in n+ source contact region 62 provides efficient contact to both the Dwell 46 backgate and the n source regions 48 permitting a reduction in the distance between gates 58 to conserve area.

photoresist layer 36a is then removed and backgate contact regions 66 annealed. Contact openings are etched and metal contacts (not shown) are formed (steps 128, 130, 132, 134 of FIG. 11) using conventional techniques to contact annular n+ source contact regions 62, n+ drain regions 64, and p+ backgate contact regions 66. p+ backgate contact regions 66 and n+ source contact regions 62 may be tied together by a single metal contact (not shown) in typical power IC applications.

Figure 12:
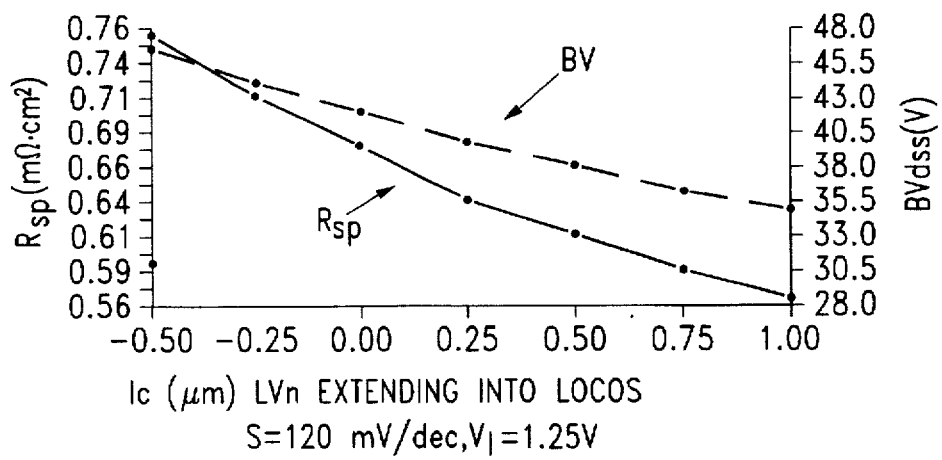
FIG. 12 is a graph showing Rsp and BV as a function of in for the LDMOS transistor according to the present invention.

FIG. 12 is a graph showing Rsp and BV as a function of 1n, where 1n is the distance low voltage Nwells 42 extend beneath LOCOS field oxide regions 54b and 54c, at Vgs= 15V. At the edge of field oxide regions 54b and 54 c adjacent n+ drain 64 regions, in is equal to zero (see FIG. 9). As seen from FIG. 12, a medium voltage LDMOS having a low Rsp is provided by the present invention.

An advantage of the invention is the ability to achieve a reduction in Rsp where breakdown voltage BV can be reduced. A reduction in Rsp results from a reduction in drift length due to the formation of LOCOS field oxide regions 54b and 54c by a minimum geometry nitride opening. This reduction in drift length reduces the device area thus reducing Rsp since Rsp=Rdson*Area. Rsp is also reduced by the addition of low voltage (n+) Nwell 42 to the drift region since low voltage (n+) Nwell 42 is more heavily doped than high voltage (n−) Nwell 38 thus reducing Rdson. The low voltage Nwell 42 added to the drift region also provides a reduction in breakdown voltage BV by increasing the field in the curvature region of the Dwell 46. Another advantage of the invention is the provision of a medium voltage LDMOS transistor having low Rsp that is compatible with a VLSI process.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transistor, comprising:

a semiconductor layer having a first region of a first conductivity type, said first region having a first dopant concentration;

a pair of second regions of said first conductivity type first formed at a face of said semiconductor layer in said first region, said second regions having a second dopant concentration greater than said first dopant concentration;

a pair drain regions of said first conductivity type formed at a face of said semiconductor layer in said second regions, said drain regions having a third dopant concentration greater than said second dopant concentration;

a third region of a second conductivity type opposite said first conductivity type formed at a face of said semiconductor layer in said first region, said third region formed between said pair of second regions;

an annular source region of said first conductivity type formed at a face of said semiconductor layer in said third region, a pair of channel regions defined in said third region between an edge of each of said pair of source regions and an associated edge of said third region; and an annular gate extending over said pair of channel regions.

2. The transistor of claim 1 in which said semiconductor layer is an epitaxial layer of said second conductivity type and said first region is a well of said first conductivity type formed in said epitaxial layer.

3. The transistor of claim 1, further comprising:

a pair of drain contact regions formed at a face of said semiconductor layer, each of said pair of drain contact regions in an associated one of said pair of drain regions;

a pair of thick insulator regions formed at a face of said semiconductor layer, each of said pair of thick insulator regions between an associated one of said pair of drain contact regions and said third region, each of said pair of second regions extending beneath at least a portion of an associated one of said pair of thick insulator regions, said annular gate extending onto said pair of thick insulator regions.

4. The transistor of claim 3 in which said pair of thick insulator regions are a field oxide regions.

5. The transistor of claim 1 further comprising: a source contact region of said first conductivity type formed at a face of said semiconductor layer in contact with said pair of source regions, said source contact region having a plurality of windows;

a plurality of back contact regions of said second conductivity type formed at a face of said semiconductor layer in said windows in contact with said third region.

6. The transistor of claim 1 in which said first conductivity type is n and said second conductivity type is p.

* * * * *